US006562079B1

(12) United States Patent
Takamatsu

(10) Patent No.: US 6,562,079 B1
(45) Date of Patent: May 13, 2003

(54) MICROWAVE DISCHARGE APPARATUS

(76) Inventor: Toshiyuki Takamatsu, 20-15, Midirigaoka 1-chome, Yachiyo-shi, Chiba, 276-0049 (JP)

( * ) Notice: Subject to any disclaimer, the term of this patent is extended or adjusted under 35 U.S.C. 154(b) by 0 days.

(21) Appl. No.: 09/743,070

(22) PCT Filed: Jul. 6, 1999

(86) PCT No.: PCT/JP99/03650

§ 371 (c)(1),
(2), (4) Date: Jan. 4, 2001

(87) PCT Pub. No.: WO00/03566

PCT Pub. Date: Jan. 20, 2000

(30) Foreign Application Priority Data

Jul. 13, 1998 (JP) .......................................... 10-229888

(51) Int. Cl.[7] ............................................. C23C 16/50
(52) U.S. Cl. ..................................................... 718/723
(58) Field of Search ............................ 118/723, 723 E, 118/725; 156/643; 250/250; 427/39, 47

(56) References Cited

U.S. PATENT DOCUMENTS

| 4,913,928 | A | * | 4/1990 | Sugita et al. ................ 427/571 |
| 4,962,054 | A | * | 10/1990 | Shikata ........................ 438/179 |
| 4,985,113 | A | * | 1/1991 | Fujimoto et al. ............ 438/694 |
| 5,099,790 | A | * | 3/1992 | Kawakami ........... 118/723 MR |
| 5,104,634 | A | * | 4/1992 | Calcote ....................... 427/577 |
| 5,314,839 | A | * | 5/1994 | Mizutani et al. ............ 438/396 |
| 6,192,828 | B1 | * | 2/2001 | Takahashi et al. ....... 118/723 E |
| 6,401,359 | B1 | * | 6/2002 | Amano ........................ 438/716 |

FOREIGN PATENT DOCUMENTS

| JP | 62-247836 | 10/1987 |
| JP | 05-3732 | 1/1993 |
| JP | 07-220896 | 8/1995 |
| JP | 07-220897 | 8/1995 |
| JP | 09-129613 | 5/1997 |

* cited by examiner

Primary Examiner—Jack Berman
Assistant Examiner—Johnnie L. Smith, II
(74) Attorney, Agent, or Firm—Frishauf, Holtz, Goodman & Chick, P.C.

(57) ABSTRACT

A discharge tube (31) provided inside the cavity of a waveguide (4) is so structured as to monotonously decrease the cross section of the cavity in the direction in which the microwave travels and thereby to close the cavity. The waveguide (34) has vent holes (34a, 34c) made through the tube wall. A metallic member (32) monotonously decreasing the cross section of the cavity in the direction in which the microwave travels and thereby closing the cavity is provided on the opposite side to the discharge tube (31) in the direction in which the microwave travels. A fluid is made to flow through the metallic member. A gas introducing port is provided in the discharge tube (31), and a gas exhaust port is provided also in the discharge tube (31) on the opposite side to the gas introducing port with respect to the center axis of the waveguide (34). Thus, no standing wave is generated from the time when a plasma is created, the plasma absorbs energy at high efficiency, the temperature at the wall of the discharge area little increases, and the density of active particles is high.

11 Claims, 3 Drawing Sheets

MICROWAVE DISCHARGE APPARATUS

CROSS REFERENCE TO RELATED APPLICATION

This application is a U.S. National Phase Application under 35 USC 371 of International Application PCT/JP99/03650 (not published in English) filed Jul. 6, 1999.

1. Technical Field

This invention relates to a microwave discharge apparatus for creating and keeping a plasma with efficiently absorbing microwave and not generating much reflected wave, and efficiently cooling the discharge vessel made of dielectric substance.

2. Background Art

Surface treatments such as etching, Plasma Chemical Vapor Deposition (PCVD) and heat treatment, has already been applied to various industrial fields. Particularly, Plasma Downstream Treatment with setting a sample in the down stream of plasma causes little damage on the sample and is expected for various applications and developments mainly in the field of semiconductor in the future.

The most important role of plasma in Plasma Down Stream Treatment is to efficiently generate active particles for use in the process. A microwave on 2.45 GHz band is often selected to excite plasma, because plasma-generating apparatuses using the waveband can be produced at low cost and the microwave with the band range enables more efficiently dissociating gas molecules than RF.

The most typical type of practical microwave plasma-generating apparatuses has a structure that a cylindrical dielectric tube, often made of quartz, is provided along an axis vertical to a rectangular-waveguide wall normal to the electric field direction of the microwave, or the H plane wall, through the center of the wall.

A dielectric tube is always exposed to an incident wave in the electric-discharge structure if an unreflective termination is formed at a point reached by the microwave passing through the tube, on the opposite side to the magnetron. However, a terminal face is generally formed with a plunger in order to reflect a wave to generate a standing wave and the dielectric tube is located at the maximum point in the electric field. The structure is applied to generate plasma easily in the stronger electric field than the one created just by the incident wave and to convert the energy efficiently from the microwave into plasma.

However, when plasma is generated, the impedance in the dielectric tube changes considerably, from the previous one almost same as the one under vacuum, and then the electric field is disturbed around the dielectric tube and has the maximum value at another point.

The proper gas composition and pressure etc. should be selected to apply to a requested plasma treatment. The impedance of the plasma depends on the factors such as gas composition and pressure etc. Therefore, the phase of standing wave at the dielectric tube should be properly tuned in the process with, for example, a plunger. Consequently, the structure is not practically useful. Further, the dielectric-tube cannot include many electric peaks of the microwave due to the structure itself. The energy is converted into plasma at low rate. The structure suffers much loss in the thermal conversion.

Generally, an isolator and a matching device are provided between the microwave emitting part and the electric-discharge load to deal with the reflected standing wave. The structure costs much because of the attachment.

The plasma-generating apparatus, which has a cylindrical dielectric tube penetrated obliquely from the center of the H plane wall or located parallel to the direction in which the microwave travels at the cross-sectional center of the waveguide, was devised and put to practical use by MTI Inc. or Fusion Inc. so as to follow the shift of the maximum point in the electric field on generating plasma and generate plasma easily.

In each structure, a dielectric tube occupies just some area linking one central part of the waveguide wall perpendicular to the microwave electric field direction, or the H plane wall, to the counterpart of wall in the cross section of the waveguide. Each side of the area is vacant.

Therefore, it is difficult to have whole microwave absorbed in such structures without passing through both sides of the dielectric tube.

Gas certainly passes through the maximum point of the electric field, if a microwave is in $H_{01}$ transmission mode. The dielectric tube, however, does not always cover the maximum point, if the point is not around the center of the H-plane wall, for example, in $H_{02}$ mode. Therefore, if a rectangular waveguide is used in the apparatus, the microwave has to be tuned into the $H_{01}$ transmission mode. The design of the apparatus is severely restricted due to the reason.

Furthermore, after plasma is generated in the cylindrical dielectric tube, the condition is equivalent to the one in the situation that a metallic rod is inserted into the waveguide. Then, the transmission mode in it changes and reflected wave is generated.

Therefore, a solid circuit such as a matching device or an isolator has to be provided between the magnetron microwave oscillator and the load. That results in not only the restriction in designing an apparatus but also lowering of efficiency as each functional parts are connected in the solid circuit, and the electric transmission has a loss.

A microwave plasma apparatus, which is devised to be provided a microwave transmission window in it parallel to the E plane wall, on the E plane wall of the waveguide or the extension plane of the wall so that plasma can absorb whole microwave passing through the waveguide, was disclosed as an apparatus overcoming the disadvantage in Japanese Patent Publication No. 5-3732.

In the disclosure, however, a dielectric material for the microwave-transmission window covers most of the wall, or the H plane wall, normal to the microwave electric field direction and a reflection from the plasma-generating part surrounded by dielectric members itself increases with the plasma-generating part projecting into the waveguide. If the plasma-generating part projects out of the waveguide wall, the height, or the length vertical to the H plane, of the plasma-generating part is required to be possibly decreased to maintain the transmission mode in the waveguide. Therefore, the structure also restricts the design of an apparatus severely and is inferior for the cost of production. An apparatus, which has a plasma-generating part formed unreflective-termination-shaped in order to solve the problem of the electric field change on generating plasma and maintain the plasma efficiently thereafter, was disclosed in Japanese Non-examined Patent Publication No. 7-220896 and 7-220897. In the structure, however, a disturbance of the electric field in the waveguide rises before a plasma discharge. Plasma is not easily generated with excitation by a microwave, depending on gas component for requested plasma because of its impedance, and actually reflected wave is generated, though the plasma generating part in the dielectric tube can be unreflective-termination-shaped after a plasma discharge.

Thus, the standing wave affects the magnetron oscillator while plasma is maintained. Practically, at least, an isolator has to be provided between the microwave oscillator and the load to protect the magnetron. The installation induces the restriction of cost and design on the apparatus, and lowers efficiency by transmission loss. Furthermore, in the structure, electric-discharge particles are heated to a high temperature by plasma radiation heat, and the heating prompts recombination reaction of radicals dissociated by plasma for a treatment. Consequently, the structure has a disadvantage of lowering dissociation efficiency.

Accordingly, an object of the invention is to eliminate the above disadvantages of the existing microwave discharge apparatuses. In other words, the object is to solve the problem such as the change of the electric field and the generation of a standing wave on generating plasma and maintain the plasma efficiently thereafter.

It is another object of the present invention is to produce apparatuses with abilities not only to induce plasma dissociation efficiently for the applied microwave power but generate and maintain requested particles efficiently by cooling the walls of the discharge vessel.

It is another object of the present invention is to produce a smaller apparatus costlessly.

DISCLOSURE OF THE INVENTION

In the invention, a microwave plasma-generating vacuum vessel, in which plasma is generated with excitation by a microwave with a wavelength of $\lambda$ under low pressure, is a dielectric tube provided in a waveguide. The shape of opening of the tube on cross sectional plane perpendicular to the direction which the dielectric tube extends to is non-circular or polygonal, at least, in a section with a length of L. Z axis is parallel to a tangent, which is drawn along the direction which the dielectric tube extends to and includes any point P in the section L. X axis is parallel to one of continuous segments which traverse the cross section of the dielectric tube normal to Z axis at the point P (not traverse the tube wall) with the maximum length of d. Y axis is normal to X axis. M axis is located along the microwave progressive direction. Whatever continuous section with a length of $\lambda/4$ is selected, M axis is parallel to the ZX plane, at least, in a part of the section and form an angle of $\theta \neq (2n+1)/2\pi$ (n is an integer) radian at least at a point in the whole section. The projection of L on M axis (cosine of a segment $L_0$ drawn from an end to the other of the section L against M axis) is not less than $\lambda/4$ in length.

The generated active particles become inactive with their recombinations caused by being heated the discharge part of the dielectric tube due to absorbing energy. The unstable impression and the energy loss at an early stage of plasma generation are caused by a disturbance of the electric field in the metallic flame caused by the dielectric tube until the beginning of plasma discharge.

A metallic member for reflecting a microwave with a cooling function is inserted and located on the opposite side of the dielectric tube to the source of an incident microwave (the microwave oscillator) in the structure so as to solve the above problems.

The surface of the provided metallic member form an angle of $\theta \neq (2n+1)/2\pi$ (n is an integer) radian with M axis, at least, in a part of the surface. The dielectric tube is so located as to make a part of the tube parallel and close to apart of the metal surface. Wherein, Z axis forms an angle of $\theta \neq (2n+1)/2\pi$ (n is an integer) radian with M axis in the part of the tube. The projection of the segment L on M axis (cosine of the segment $L_0$ drawn from an end to the other of the section L against M axis) is not less than $\lambda/4$ in length. On the other hand, the part of the metal surface forms an angle of $\theta \neq (2n+1)/2\pi$ (n is an integer) radian with M axis. The projection of the part on M axis is not less than $\lambda/4$. Because of the above structure, generation of reflected waves is lowered and the problems are solved.

A surface of the metallic member is formed on the opposite side of the dielectric tube to the direction in which a microwave travels. Thus, a re-entrant cavity is formed by the surface of the metallic member and the waveguide wall. The cross section of the cavity monotonously decreases along the microwave-traveling direction to the closed end. A microwave converges with traveling in the cavity and is efficiently absorbed by the dielectric discharge tube formed unreflective-termination-shaped and provided on side of the metallic member to the direction in which a microwave travels.

Same results are obtained by a system described below. A metallic member with a surface shaped to fit for the surface of the discharge tube is provided on the opposite side to the direction in which a microwave travels. Otherwise, the tube surface opposite to the direction in which a microwave travels is coated by metal or attached by a metallic plate or foil.

The metallic member, plate, foil or coat is cooled by gas or liquid. The metal cools the dielectric discharge tube.

The dielectric discharge tube combined with the metal is double-structured or holds a coolant conduit in it only on the face opposite to the microwave source direction so that the liquid can directly cool the dielectric discharge tube. Thus, gas is dissociated into plasma with absorbing microwave on the microwave-source side in the discharge tube. The tube is directly cooled by coolant on the opposite side to the microwave source.

The coolant conduit is sandwiched between the metal and the discharge part in the structure and shaped same as the unreflective-termination-shaped metal surface. Therefore, the conduit operates as an effective unreflective resistance and helps lower generation of the reflected wave.

The microwave-traveling side of the dielectric discharge tube is heated by absorbing microwave and heat radiation after the plasma generation. The gas introducing port is formed on a waveguide wall to cool the surface with coolant gas. A part of the waveguide including the discharge tube is cooled by the surroundings because the waveguide is connected with the cooling block such as metallic member.

BEST MODE OF WORKING THE INVENTION

This invention will be described in the further detail with reference to the accompanying drawings.

Figure 1:
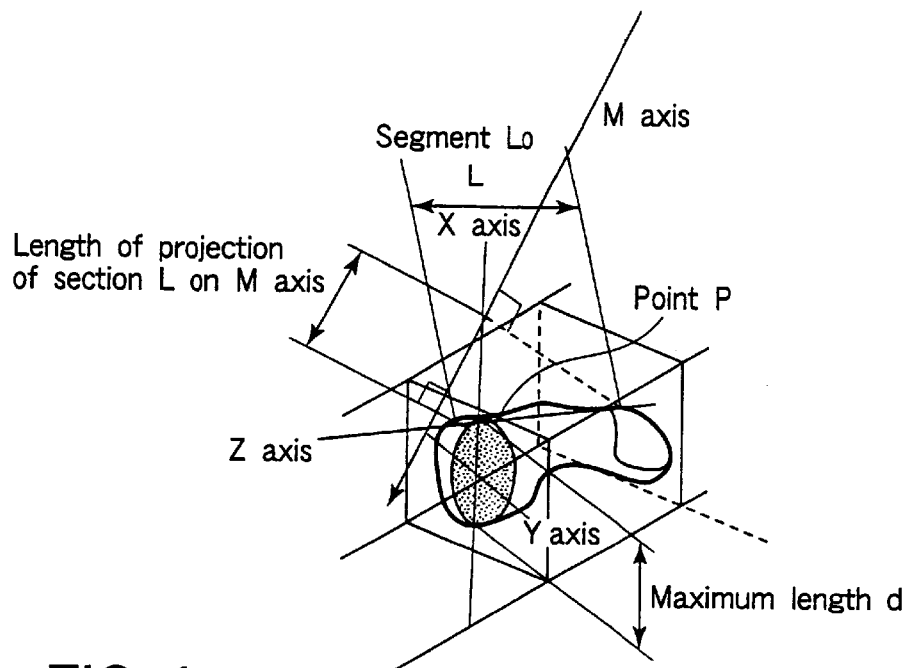
FIG. 1 is a diagram illustrating the theory of the microwave discharge structure of this invention.

FIG. 1 specifies the general structure of the discharge tube of this invention. The tube is made of dielectric material. M axis represents the direction in which a microwave travels.

The surface of the metallic member has a similar shape to the facing surface of the discharge tube. The tube is located close to the dielectric tube on the opposite side to the direction in which a microwave travels and cooled.

Thus, the phase of a microwave converges and many peaks of it are generated between the inclined surface of the metallic member and the waveguide walls or the walls of the metallic flame connected with the waveguide. Consequently, the plasma discharge is easily caused in the dielectric tube located close to the metal surface on the microwave oscillator side from the beginning of microwave oscillation till the beginning of the electric discharge. The plasma in the dielectric tube absorbs the microwave after the plasma discharge.

The projection of the dielectric tube on M axis is not less than $\lambda/4$ in length. There are many peaks of the wave in the projection. Therefore, the dielectric tube can always maintain absorbing a microwave, even if the impedance of plasma changes by a continuous change of gas composition, gas pressure, electric power, or gas flow. Consequently, plasma discharge is maintained stably, and the apparatus can be designed without costly microwave circuit parts such as an impedance matching device and an isolator.

Furthermore, the inserted metallic member cools the dielectric tube as another function. The recombination of active particles created by plasma in the dielectric tube decreases. Accordingly, the density of the plasma is increased by the increase of the electric power supplied to microwave oscillation.

Figure 2:
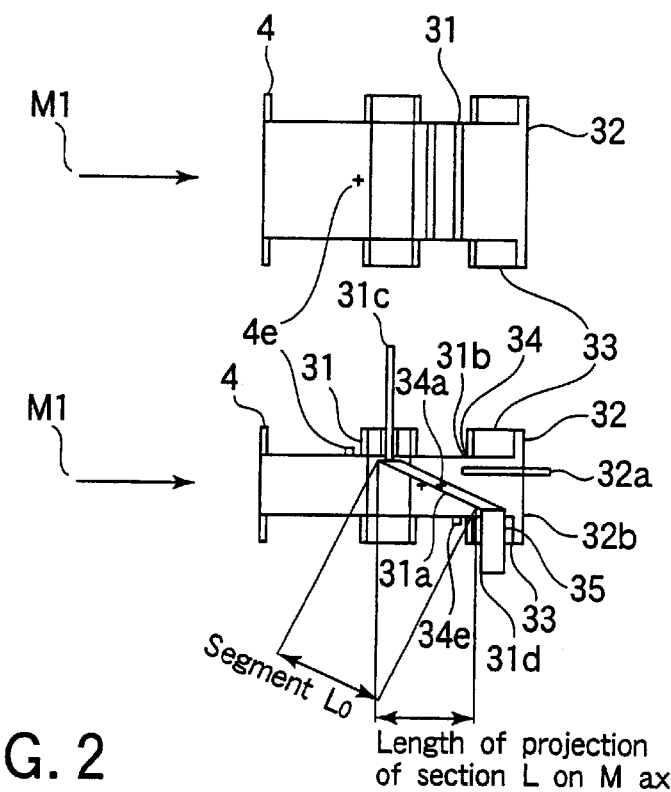
FIG. 2 shows sectional views of a preferred microwave discharge structure of the present invention.

FIG. 2 shows horizontal and vertical sectional views of a preferred electric-discharge structure designed with following the theory of the invention shown in FIG. 1.

The plasma discharge part 31 is made of quartz. The first quartz plate 31a is opposite to the second quartz plate 31b. The bottom and side of the part are closed. The part is used as a vacuum vessel and connected with a gas introducing tube 31c and a gas exhaust tube 31d.

The cross section of the vessel is a quadrilateral in the dielectric tube structure of the part. The electric-discharge part 31 is provided in the waveguide 34.

Z axis is parallel to a tangent of the dielectric tube drawn along the direction which the tube extends to on any point P in the section L. X axis is parallel to, at least, one of the longest sides (d) of the cross section of the dielectric tube. Wherein, the sectional plane is vertical to Z axis. Y axis is normal to X axis. M axis is along the direction in which a microwave travels. M axis is not parallel to ZX plane, at least, in some part of any continuous section with the length of $\lambda/4$ in the section L. M axis forms an angle of $\theta \neq (2n+1)/2\pi$ (n is an integer) radian with Z axis, at least, at a point in whole the section L.

The plasma discharge part is so structured that the projection of section L on M axis (cosine of a segment $L_0$ drawn from an end to the other of the section L against M axis) is not less than $\lambda/4$ in length. The projection of the section L on M axis or the direction in which a microwave travels is about 90 mm in length for a practically applied microwave with a frequency of 2.45 GHz (a wavelength of about 120 mm).

A rectangular flanges with a same size as the cross section of the waveguide 34 or the flange which links waveguides. The plasma discharge part 31 is attached to the flange tube and held in connection with the gas introducing tube 31c and the gas exhaust tube 31d with bolts. A part of the flange tube are combined with the other and fixed to the waveguide 34 and also the waveguide 4 with bolts. Thus, the discharge part is provided in the waveguide.

The gasket tube 35 is combined with the two-parts-divided rectangular flange tube 33. It is designed to be a $\lambda/4$-choking structure with the pierced holes of the gas introducing tube 31c and the gas exhaust tube 31d. Thus, safety of the apparatus is ensured.

At least, some part of the metal surface forms an angle of $\theta \neq (2n+1)/2\pi$ (n is an integer) radian with M axis. wherein, the metal surface is close to the second quartz plate of the plasma discharge part in the plasma discharge part 31 on the opposite side to the microwave oscillator direction.

The projection of the metal surface on M axis is not less than $\lambda/4$ in length. Z axis on the dielectric tube forms an angle of $\theta \neq (2n+1)/2\pi$ (n is an integer) radian with M axis. The projection of section L on M axis (cosine of the segment $L_0$ drawn from an end to the other of the section L against M axis) is not less than $\lambda/4$ in length. The metal surface of the metallic member forms an angle of $\theta \neq (2n+1)/2\pi$ (n is an integer) radian with Maxis. The projection of the metal surface on M axis is not less than $\lambda$ in length on metallic unreflective-termination-shaped cooling block 32.

The block has a connecting flange same-sized as the two-parts-divided rectangular flange tube 33 and fixed to the two-parts-divided rectangular flange tube 33 with bolts.

The unreflective-termination-shaped cooling block 32 has a channel for water coolant and is cooled by water flowing through a water coolant introducing tube 32a so that the block could indirectly cool the second quartz plate 31b in the plasma discharge part located close to the unreflective-termination-shaped cooling block 32, whole the plasma discharge part 31, the two-parts-divided rectangular flange tube 33 connected with the cooling block 32 and whole the solid circuit including the waveguide 34.

The unreflective-termination-shaped cooling block 32 has a coolant gas port 32b. Nitrogen or air is introduced into a gap between the plasma discharge part 31 and the unreflective-termination-shaped cooling block 32 as coolant gas.

Thus, cooling efficiency is intended to be maid higher by prompting thermal transplant in the gap between the plasma discharge part 31 and the unreflective-termination-shaped cooling block 32. On some part of, or whole, the gap between the plasma discharge part 31 and the unreflective-termination-shaped cooling block 32, grease for heat radiation is applied or a heat-radiating sheet is inserted in some case.

In FIG. 2, the tilted face of the electric-discharge part closes the cavity downward along the direction in which a microwave travels. A port for introducing a gas, which is dissociated into plasma, is designed to be on the upside.

Same results are obtained by a structure as follows. The tilted face of the electric-discharge part closes the cavity downward. The gas introducing port is on the upside The gas exhaust port is on the microwave oscillator side of the vessel.

Figure 3:
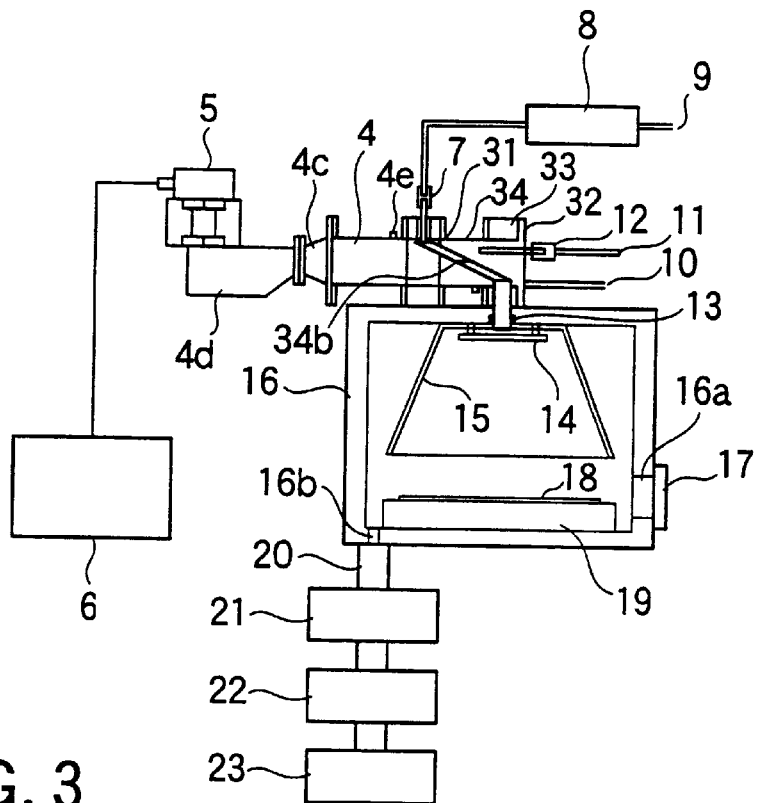
FIG. 3 is a sectional view of a microwave plasma treatment apparatus with the microwave discharge structure of the invention.

FIG. 3 is a cross section of a microwave discharge apparatus with the microwave discharge part. A magnetron microwave oscillator 5 is connected with the microwave power supply 6. The microwave oscillator is coupled with the rectangular waveguide system 4 connected with the plasma discharge part 31 of this invention. The plasma discharge part is connected with a process chamber 16.

The chamber is connected with a gas exhaust port 16*a*, a gas exhaust tube 20, a gas pressure control valve 21, a valve 22, and a vacuum pump for reducing pressure 23 consecutively.

Gas for plasma is provided into the plasma discharge part 31 through a process gas introducing tube 9, flow control apparatus 8, and a fitting 7.

The apparatus of the present invention will be schematically described below.

A sample stage 19, on which a sample 18 is placed, is provided in a process chamber 16. A sample 18 is put into the process chamber through a sample gateway 16*a*. The rectangular waveguide system 4 is provided on the upside of the process chamber. The plasma discharge part 31 is provided in the waveguide and connected with the process chamber.

The joint is sealed with an O-ring 13. A diffusion plate 14 is provided between the plasma discharge part 1 and the sample 18 in order to diffuse etching particles. A cover 15 made of quartz or ceramic is provided to reduce recombinations of the etching particles in the process chamber.

The metallic unreflective-termination-shaped cooling block 32 is located on or close to the plasma discharge part 31 on the opposite side of the part to the direction in which a microwave travels. While the unreflective-termination-shaped cooling block 32 is cooled by coolant water from the coolant-water introducing tube 11, nitrogen or air as coolant gas is introduced into a gap between the plasma discharge part 31 and the unreflective-termination- shaped cooling block 32 from the coolant gas introducing port.

The manner of operation will be described below. Referring to FIG. 3, after a sample 18 is put in the process chamber 16, pressure in the process chamber 16 and the plasma discharge part 1 is reduced by operation of a vacuum pump for reducing pressure and opening a valve 22. Gas for plasma is provided into the plasma discharge part 1 from process gas introducing tube 9 through a flow controlling apparatus 8 and tubes linked by a fitting 7.

Then, a microwave controlled by a microwave power supply 6 is oscillated from the magnetron microwave oscillator 5. The microwave travels to the plasma discharge part 31 and the unreflective-termination-shaped cooling block 2 through the waveguide system 4.

The phase of the microwave converges and many wave peaks are generated in a wedge-shaped cavity between the metal face of the unreflective-termination-shaped cooling block 32 and the H plane wall of the waveguide 4.

Thus, some high peaks of the electric field are on the dielectric face of the plasma discharge part 1, which is located close to the metal face of the unreflective-termination-shaped cooling block 2 on the side of the microwave oscillator. Consequently, plasma discharge starts easily.

Moreover, after the beginning of the plasma discharge, plane-shaped plasma is generated in the electric-discharge part due to the shape of the plasma discharge part. A microwave is absorbed without reflection in the equivalent situation that an unreflective-termination-shaped resistance with a sheet shape emerges in the waveguide 4.

The projection of the tilted surface of the plasma discharge tube on an axis in which a microwave travels is not less than $\lambda/4$ in length. A phase of a microwave converges and many peaks exist in a wedge-shaped cavity between the tilted face of the plasma discharge tube and the H plane wall of the waveguide 4.

Consequently, even if an impedance of a plasma load shifts due to continuous changes of gas component, gas pressure, power and gas flow, the plasma discharge tube always absorbs a microwave, and power of a reflected wave, which travels in the direction opposite to the one an incident microwave travels in, is extremely low in the waveguide. Due to the efficient absorption of microwave power by the plasma as load, the plasma discharge tube is heated much by microwave consumption in the dielectric material and radiation of the plasma.

The heating, however, results in disadvantages as follows. Active gas particles created by plasma recombine on the wall of the plasma discharge tube and become inactive. Some quartz parts of the plasma discharge tube can melt in a process with 500 watt of microwave power for 20 minutes. To overcome these disadvantages, the plasma discharge part has to be efficiently cooled.

Gas is introduced through the coolant gas introducing port 34*a* formed on a wall of the waveguide 4 and exhausted through the coolant gas exhaust port 34*b*. Thus, the plasma discharge part provided in the waveguide 4 is cooled. The unreflective-termination-shaped cooling block 32 is cooled by water and located on or close to the plasma discharge part 31. The unreflective-termination-shaped cooling block 32 also has the coolant gas introducing port 32*b*.

Nitrogen or air as coolant is introduced into the gap between the plasma discharge part 31 and the unreflective-termination-shaped cooling block 32 through the coolant gas introducing port 10. The gas prompts thermal conduction in the gap between the plasma discharge part 31 and the unreflective-termination-shaped cooling block 32.

Whole the plasma discharge part 31 is cooled by the above structure. Consequently, generation of reflected waves is lowered for whole the operating time from the beginning of the microwave electric discharge to the end of it because of the shape and the setting of the plasma discharge part.

Microwave power is efficiently converted into plasma without costly parts a matching device and an isolator. Generation of abnormal electric discharges such as arc in the waveguide is lowered because the power of the standing wave is extremely low even with increasing the microwave power. Accordingly, the plasma density is increased with increasing the power of the incident microwave.

The plasma discharge part is efficiently cooled. Thus, the process efficiency improves while the density of the plasma active particles hardly declines due to increase of the power.

Active particles generated in the plasma discharge tube 31 is introduced into the process chamber 16 along the direction of exhaustion and diffused by the quartz diffusion plate 13 with many pores on it. After the active particles reach a sample 18, the sample is treated with a requested process of reaction. Waste products by the reaction are exhausted into the vacuum pump (reduced pressure) through the exhaust port 16*b* of the process chamber.

The sample stage 19 can be thermal-controlled with heating and cooling in some cases, if it is needed. The cover 15 is made of quartz. The cover prevents the density deterioration of active particles induced by their recombinations on the metal surface and controls directions which active particles diffuse.

Sizes and quantities in practice will be described below for example. The rectangular waveguide 4 is a WRJ-2 type of JIS (Japan Industrial Standards). Referring to the size of the opening of the waveguide, the longer side (on H plane wall) is 109.2 mm and the shorter side (on E plane wall) is 54.6 mm. The length of the waveguide is 200 mm.

The rectangular waveguide 34 is also a WRJ-2 type of JIS and measures 60 mm long. The straight tube is used for the waveguide 4 in this embodiment. Length of a waveguide is not definite. An E-corner bent waveguide or an H-corner bent waveguide may be used.

The plasma discharge tube measures about 103 mm long (along the central axis), 102.6 mm wide, and 16 mm thick. The thickness of the inner tube channel is 10 mm. The diameter of the gas introducing tube 31d is 6.35 mm. That of the gas exhaust tube 31c is 25.4 mm. The microwave oscillator applies 2.45 GHz of oscillation frequency, 1000 watt of power output, 50 or 60 Hz of input frequency, AC 200 V of input voltage, and less than 15 A of input amplitude.

Power of reflected wave is measured with the directional coupler inserted between the microwave oscillator 5 and the waveguide 4.

The condition of the plasma generation in this embodiment will be described below. The degree of vacuum is 0.1–10 torr. The flow of introduced gas ($N_2O_2$ and mixed gas of them) 50–3000 cc/min. The applied power for incident microwave is 50–1000 w. A stable electric discharge starts under these conditions. A rotary pump with capacity of 1000 litter/min and a vacuum gauge are used in the vacuum system. Pressure is controlled with the auto butterfly-valve angle control method.

The following example is an examination of the treatment efficiency of this embodiment. The photo resists with 2 $\mu$m of thickness coating the 6-inch silicon substrates were respectively examined to be removed under the same condition with the apparatus of this invention and the same apparatus except the plasma discharge part of the structure in FIG. 4 in comparison.

The condition is as follows. Sample stage temperature: 200° C. Microwave power: 800 w. Oxygen-Nitrogen gas flow (Oxygen: 1900 sccm, Nitrogen: 100 sccm). Process time 30 s.

As a result, the erosion rate of the photo resist was 3.5 $\mu$m/min in the treatment with the apparatus of this invention. It is 36% higher than 2.8 $\mu$m/min with the apparatus including the plasma discharge part of the structure in FIG. 4.

The durability of the plasma discharge part was examined with the continuous electric discharge. The electric-discharge part did not glow even for 30 minutes of the continuous electric discharge at 1000 watt. The cooling efficiency of the plasma discharge part in the embodiment is proved.

The powers of incident microwave and reflected wave were measured after the directional coupler was inserted between the waveguide 4c, which was connected with the microwave oscillator, and the waveguide 4 with the electric-discharge part.

The power supply of half-wave rectified wave was used as the microwave power supply to supply 60 watt for microwave power. The electric power of reflected wave measured about 50–100 watt under less than 1.0 torr of pressure. On the other hand, the electric power of reflected wave measured about 0 watt under 1.0–10 torr of pressure, though a matching device or an isolator was not connected in the microwave solid circuit.

When the DC power supply was used as the microwave power supply, the power of reflected wave was 0 watt under more than 0.4 torr.

These results were obtained due to the following reasons. Electrons were not continuously supplied in plasma with half-wave rectified microwave. The electric current extremely decreased with the electron density decreasing in plasma under low pressure. Then the plasma impedance extremely increased. Electrons were continuously supplied in plasma with DC power supply and the impedance did not increase extremely.

Figure 4:
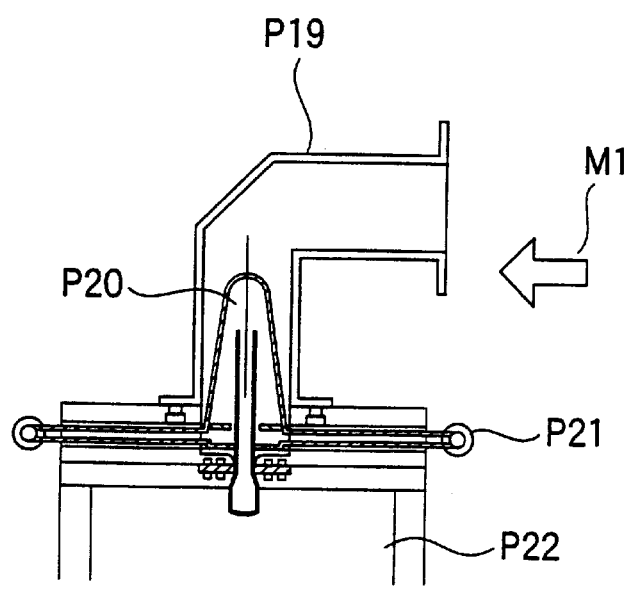
FIG. 4 is a sectional view of a discharge structure referred to confirm the effects of the invention in comparison.
Figure 5:
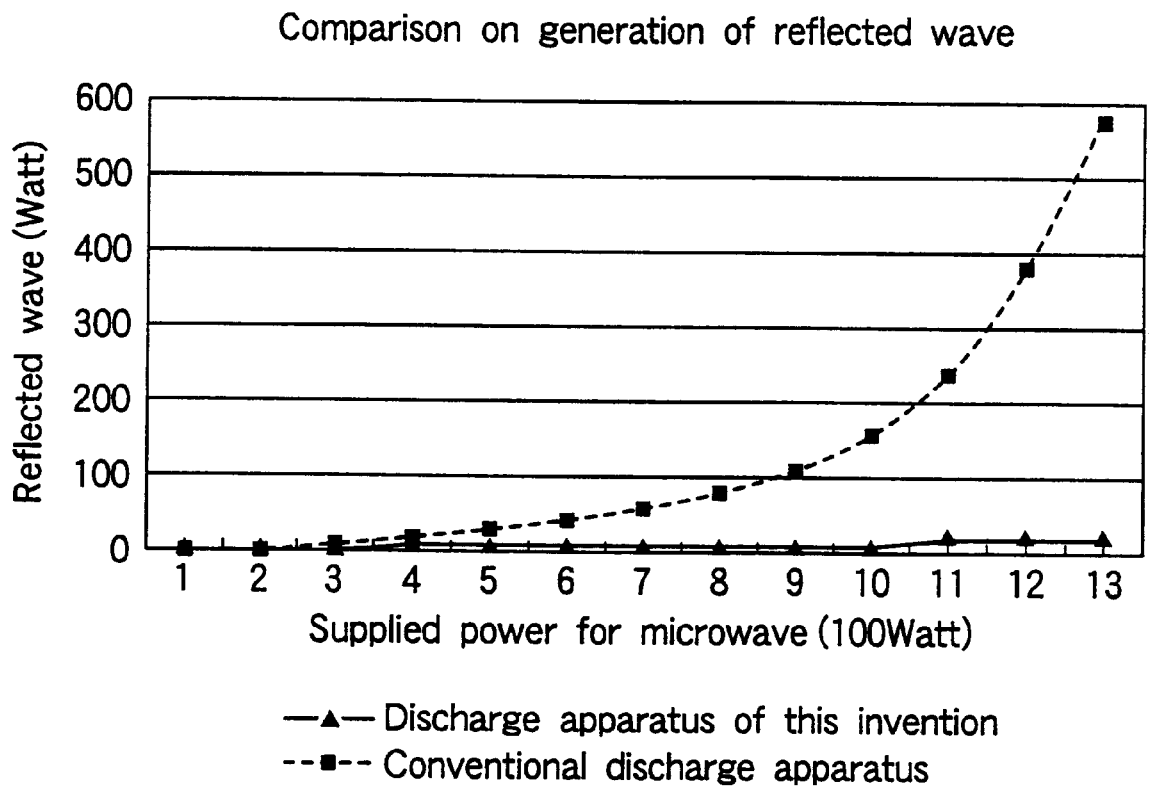
FIG. 5 is a graph comparing amounts of reflected waves in the discharge structure of the invention with ones in the reference in FIG. 4

FIG. 5 shows power of reflected wave to supplied microwave power with the apparatus of this invention, as comparing with the apparatus of FIG. 4. Nitrogen gas was used under 1.5 torr of pressure in the process condition. The magnetron microwave oscillator with the maximum power of 1.7 kw (Panasonic T-454) was used. The directional coupler (Toshiba TMU-605A) was inserted between the oscillator and the electric-discharge part supplied microwave power. Then, the power of reflected wave was measured.

With a conventional apparatus, reflected wave increases with supplied microwave power increasing. With the apparatus of the invention, however, no generation of reflected wave was observed.

A conventional apparatus do not follow the impedance shift around a start of discharge at all. Therefore, the loss coefficient rises by increase of the standing wave which increases with a supplied power increasing, though a reflected wave is weak enough to be neglected in the low region of supplied power.

The other dielectric materials can be replaced, though quartz is used for the material of the plasma discharge part 31 in the embodiment. For example, especially all the ceramics (Alumina such ceramics, carbon compounds) and heat resistant plastics are proper.

As is described above, plasma discharge is efficiently generated without generating reflected wave in the plasma discharge part due to the structure of the plasma discharge part in the invention. Plasma is generated with the impression of discharge, which easily risen with the structure, without reflected wave, because the unreflective-termination-shaped cooling block is located on or close to the surface of the plasma discharge part opposite to the direction in which a microwave travels.

Furthermore, the surface of the plasma discharge tube facing to the direction in which a microwave travels is cooled by gas. The surface of the plasma discharge tube opposite to the direction in which a microwave travels is cooled directly with liquid or with gas, heat radiating grease or heat radiating sheet in the gap between the plasma discharge part and the unreflective-termination-shaped cooling block set on the opposite side of the plasma discharge tube to the direction in which a microwave travels. Because of the cooling, the results as follows are obtained. The plasma discharge part itself is prevented from being heated in a process. Besides, active particles are prevented from recombination due to that. Plasma density is increased with selecting an efficient process condition such as increasing supplied microwave power. Consequently, process efficiency is improved.

The plasma discharge part is secured to be safe. The reliability of whole the apparatus is improved.

Furthermore, costly devices such as a matching device and an isolator are not necessary in the microwave solid circuit because the structure lowers reflected wave even from the beginning of an electric discharge.

What is claimed is:

1. A microwave electric-discharge apparatus, comprising a waveguide and a dielectric discharge tube provided in a cavity of the wave guide or an extension part of the waveguide, characterized in that the dielectric discharge tube is so formed that the cavity closes to the end with the cross section of the cavity monotonously decreasing along the direction in which a microwave travels in the waveguide, and that a gas port is formed through a waveguide wall.

2. A microwave electric-discharge apparatus according to claim 1, wherein the discharge tube has a gas introducing port on the opposite side to a gas exhaust port with respect to the central axis of the waveguide or an extension part of the waveguide between the ports.

3. A microwave electric-discharge apparatus according to claim 1, wherein the microwave plasma-generating vacuum vessel for generating a plasma by application of a microwave with a wavelength of $\lambda$ to gas under low pressure is a dielectric tube provided in the waveguide or a metallic flame connected with the waveguide, and so formed that the shape of opening in the cross section perpendicular to the direction which the dielectric tube extends to is non-circle or polygonal, at least, within a section of the dielectric tube with a length of L, that M axis is not parallel to ZX plane, at least, within a part of any section with a length of $\lambda/4$ in the section L, that Z axis forms an angle of $\theta \neq (2n+1)/2\pi$ (n is an integer) radian with M axis, at least, at a point in whole the section L, and that the projection of the section L on M axis (cosine of a segment $L_0$ drawn from an end to the other of the section L against M axis) is not less than $\lambda/4$ in length, wherein Z axis is parallel to a tangent which is drawn on any point P in the section L along the direction which the dielectric tube extends to, X axis is parallel to one of continuous segments which traverse the cross section of the dielectric tube normal to Z axis at the point P (not traverse the tube wall) with the maximum length of d, Y axis is normal to X axis, and M axis is along the direction which a microwave travels.

4. A microwave electric-discharge apparatus according to claim 3, wherein the metallic flame enclosing the dielectric discharge tube is a rectangular waveguide, the X axis is parallel to a wall containing the longer side of the cross section of the waveguide (a wall normal to the electric field direction of a microwave or an H wall) and normal to the shorter side of the cross section of the waveguide (a wall parallel to the electric field direction of a microwave or an E plane wall), and the length of the segment d is not less than a half of the longer side of the waveguide cross section (the width of the H plane wall).

5. A microwave electric-discharge apparatus according to claim 1, wherein the unreflective-termination-shaped metallic member is provided on the opposite side of the dielectric discharge tube to the direction of the microwave oscillator (the direction of the microwave source) for terminating a microwave without reflection with contacting, at least, a part of the dielectric tube directly or indirectly with an intermediate, or located close to a part of the dielectric tube and cooled.

6. A microwave electric-discharge apparatus according to claim 2, wherein the unreflective-termination-shaped metallic member is provided on the opposite side of the dielectric discharge tube to the direction of the microwave oscillator (the direction of the microwave source) for terminating a microwave without reflection with contacting, at least, a part of the dielectric tube directly or indirectly with an intermediate, or located close to a part of the dielectric tube and cooled.

7. A microwave electric-discharge apparatus according to claim 3, wherein the unreflective-termination-shaped metallic member is provided on the opposite side of the dielectric discharge tube to the direction of the microwave oscillator (the direction of the microwave source) for terminating a microwave without reflection with contacting, at least, a part of the dielectric tube directly or indirectly with an intermediate, or located close to a part of the dielectric tube and cooled.

8. A microwave electric-discharge apparatus according to claim 4, wherein the unreflective-termination-shaped metallic member is provided on the opposite side of the dielectric discharge tube to the direction of the microwave oscillator (the direction of the microwave source) for terminating a microwave without reflection with contacting, at least, a part of the dielectric tube directly or indirectly with an intermediate, or located close to a part of the dielectric tube and cooled.

9. A microwave electric-discharge apparatus, comprising a waveguide and a dielectric discharge tube provided in a cavity of the waveguide or an extension part of the waveguide, characterized in that a metallic member provided in the cavity is so formed that the cavity closes to the end with the cross section of the cavity monotonously decreasing along the direction in which a microwave travels in the waveguide, and that a part of the dielectric discharge tube on the opposite surface to the direction in which a microwave travels, contacts the metallic member directly or indirectly with an intermediate between them, or is so close to the metallic member to enable heat conduction.

10. A microwave electric-discharge apparatus according to claim 9, wherein the discharge tube has a gas introducing port on the opposite side to a gas exhaust port with respect to the central axis of the waveguide or an extension part of the waveguide between the ports.

11. A microwave electric-discharge apparatus according to claim 9, wherein the unreflective-termination-shaped metallic member is provided on the opposite side of the dielectric discharge tube to the direction of the microwave oscillator (the direction of the microwave source) for terminating a microwave without reflection with contacting, at least, a part of the dielectric tube directly or indirectly with an intermediate, or located close to a part of the dielectric tube and cooled.

* * * * *